United States Patent
Kwon et al.

(10) Patent No.: US 7,982,942 B2
(45) Date of Patent: Jul. 19, 2011

(54) COLOR ELECTROPHORETIC DISPLAY DEVICE AND METHOD FOR MANUFACTURING THE SAME

(75) Inventors: Oh-Nam Kwon, Yongin-si (KR); Jae-Gu Lee, Gumi-si (KR); Seung-Chul Kang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/645,331

(22) Filed: Dec. 22, 2009

(65) Prior Publication Data

US 2010/0157411 A1 Jun. 24, 2010

(30) Foreign Application Priority Data

Dec. 23, 2008 (KR) .................. 10-2008-0132004

(51) Int. Cl.
*G02B 26/00* (2006.01)
(52) U.S. Cl. ...................................................... 359/296
(58) Field of Classification Search .............. 359/296, 359/245, 248; 430/32, 34, 38; 204/450, 204/600; 345/107, 105
See application file for complete search history.

(56) References Cited

U.S. PATENT DOCUMENTS

| | | | | |
|---|---|---|---|---|
| 6,768,846 B2 * | 7/2004 | Takeuchi et al. | | 385/120 |
| 7,322,394 B2 * | 1/2008 | Nakamura et al. | | 156/356 |
| 7,629,613 B2 * | 12/2009 | Sohn et al. | | 257/72 |
| 7,656,577 B2 * | 2/2010 | Ban | | 359/296 |
| 2009/0153942 A1 * | 6/2009 | Daniel et al. | | 359/296 |

\* cited by examiner

*Primary Examiner* — Ricky L Mack
*Assistant Examiner* — Tuyen Tra
(74) *Attorney, Agent, or Firm* — Birch, Stewart, Kolasch & Birch, LLP

(57) ABSTRACT

Discussed are a color electrophoretic display device with a color filter layer, which is formed in a droplet state on a rear surface of an electronic ink film through surface treatment so as to be capable of adjusting density of droplets in pixels and achieving correct alignment, and a method for manufacturing the same. The method includes forming a thin film transistor (TFT) array substrate including a display region, in which a plurality of pixel regions are defined in a matrix, and alignment keys provided at the outside of the display region, forming an electrophoretic layer including a micro capsule layer formed so as to correspond to the display region of the TFT array substrate, and forming a color filter layer on the electrophoretic layer using the alignment keys so as to correspond to the respective pixel regions of the display region.

6 Claims, 21 Drawing Sheets

450

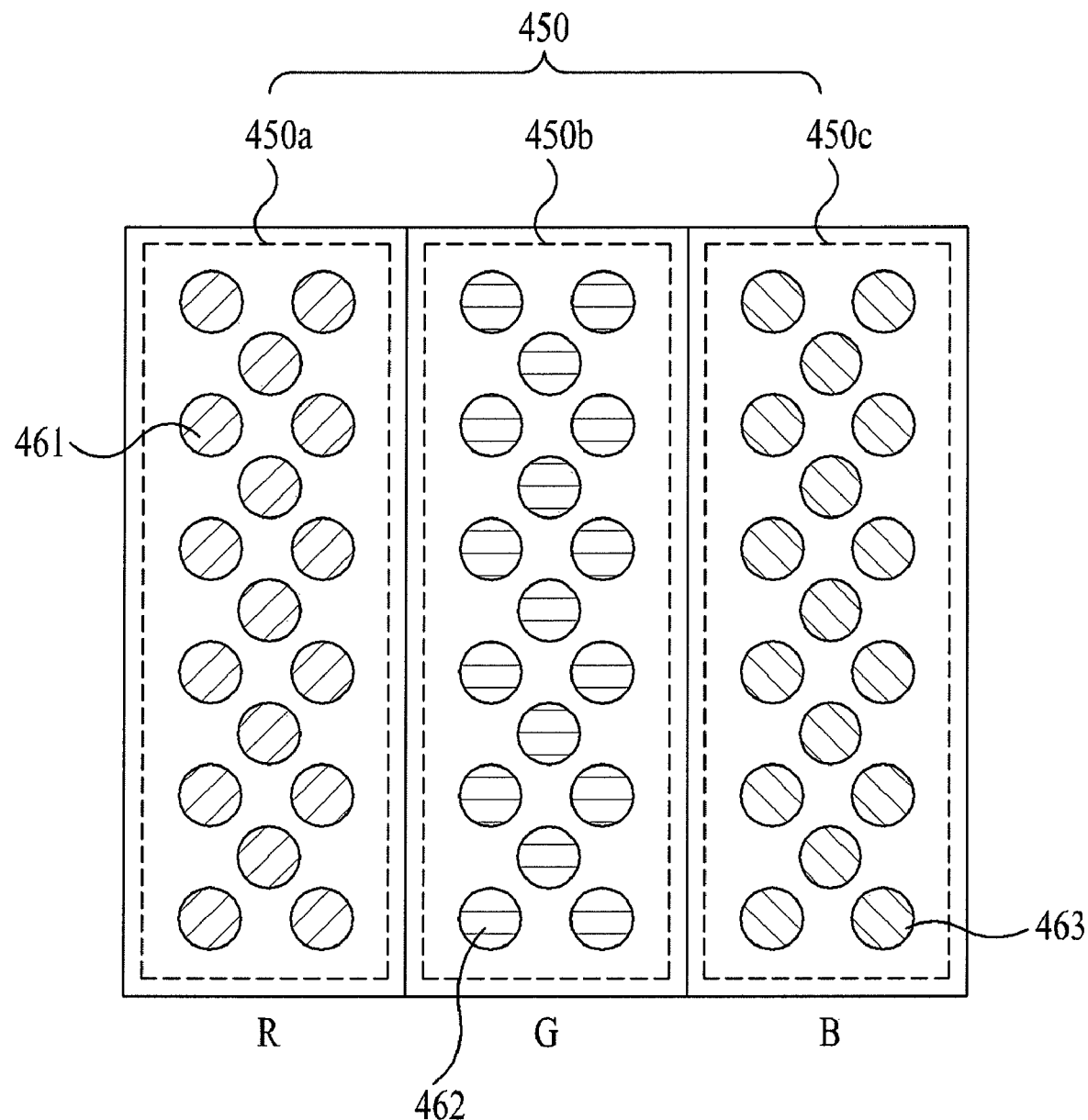

COLOR ELECTROPHORETIC DISPLAY DEVICE AND METHOD FOR MANUFACTURING THE SAME

This application claims the benefit of Korean Patent Application No. 10-2008-0132004, filed on Dec. 23, 2008, which is hereby incorporated by reference as if fully set forth herein.

BACKGROUND OF THE INVENTION

1. Field of the Invention

The present invention relates to an electrophoretic display device, and more particularly, to a color electrophoretic display device with a color filter layer, which is formed in a droplet state on a rear surface of an electronic ink film through surface treatment so as to be capable of adjusting density of droplets in pixels and achieving correct alignment, and a method for manufacturing the same.

2. Discussion of the Related Art

An electrophoretic display device (EPD) is one of flat panel display device used in E-books, and includes two display panels, on which electrodes for forming an electric field are formed, and micro capsules formed between the two display panels and containing electronic ink having black and white pigment particles respectively charged with positive and negative polarities.

The electrophoretic display device generates a potential difference at both ends of two electrodes opposite to each other by applying voltage to the two electrodes, and thus respectively moving the black and white pigment particles charged with positive and negative polarities to the electrodes having the opposite polarities, thereby displaying an image.

Such an electrophoretic display device has high reflectivity and contrast ratio and no dependence on a viewing angle, differing from a liquid crystal display device, and thus has advantages in that it displays an image in a comfortable mood like paper. Further, the electrophoretic display device has a bistable property between black and white, and thus maintains the image without continuous application of voltage, thereby reducing power consumption. Moreover, the electrophoretic display device does not require a polarization plate, an alignment film, and liquid crystals, and thus is advantageous in terms of price competitiveness.

The above electrophoretic display device and a color filter substrate disposed thereon form a color electrophoretic display device, which is capable of displaying colors.

Hereinafter, a conventional color electrophoretic display device will be described with reference to the accompanying drawings.

FIG. 1 is a longitudinal-sectional view illustrating the conventional color electrophoretic display device.

As shown in FIG. 1, the conventional color electrophoretic display device 100 usually includes a thin film transistor (TFT) array substrate 50, an electronic ink film 60, and a color filter substrate 70.

Here, the TFT array substrate 50 includes a first metal foil 12, such as steel use stainless (SUS) foil, formed on a glass substrate 10 to re-emit light emitted from the electronic ink film 60 toward an incident surface, and TFTs 13 formed on the first metal foil 12 to be driven according to respective pixels. The thin film transistor array substrate 50 further includes a second metal foil 14 formed on the rear surface of the glass substrate 10.

The electronic ink film 60 includes a micro capsule layer 25, which contains black and white pigment particles respectively charged with positive and negative polarities such that the black and white pigment particles are arranged in a designated direction through application of voltage thereto, formed on a transparent conductive film 20.

The color filter substrate 70 includes a first plastic film 32 formed on a glass substrate 30, and color filters 34 having designated colors formed in respective pixels on the first plastic film 32. The color filter substrate 70 further includes a second plastic film 31 for protection formed on the rear surface of the glass substrate 30.

Thereafter, a first adhesive layer 21 and a second adhesive layer 22 are respectively formed on the rear surface of the transparent conductive film 20 and on the micro capsule layer 25, and the color filter substrate 70 and the TFT array substrate 50 are respectively bonded to the electronic ink film 60 through the first adhesive layer 21 and the second adhesive layer 22, thereby forming the color electrophoretic display device 100.

In this case, in order to slim the device 100, after the bonding process, the glass substrate 30 and the second plastic film 31 of the color filter substrate 70 and the glass substrate 10 and the second metal foil 14 of the TFT array substrate 50 may be omitted.

However, in the conventional color electrophoretic display device 100 obtained by bonding the three panels, since the three panels are separately formed and then are bonded to each other by the bonding process carried out on both surfaces of the electronic ink film 60, a detaching process carried out, if misalignment among the three panels occurs, causes damage to the expensive electronic ink film 60, and thereby lowers image quality.

The above-described conventional color electrophoretic display device has several problems, as follows.

Since the conventional color electrophoretic display device is obtained by bonding the TFT array substrate and the color filter substrate to upper and lower surfaces of the electronic ink film through the respective adhesive layers, misalignment among the three panels may easily occur, and thereby causes damage to the expensive electronic ink film during re-working.

Subsequently, if misalignment remains, correct image display is not achieved, and if the electronic ink film is damaged, image quality at a damaged region is lowered.

SUMMARY OF THE INVENTION

Accordingly, the present invention is directed to a color electrophoretic display device and a method for manufacturing the same.

One object of the present invention is to provide a color electrophoretic display device with a color filter layer, which is formed in a droplet state on a rear surface of an electronic ink film through surface treatment so as to be capable of adjusting density of droplets in pixels and achieving correct alignment, and a method for manufacturing the same.

To achieve this object and other advantages and in accordance with the purpose of the invention, as embodied and broadly described herein, a method for manufacturing a color electrophoretic display device includes forming a thin film transistor (TFT) array substrate including a display region, in which a plurality of pixel regions are defined in a matrix, and alignment keys provided at the outside of the display region, forming an electrophoretic layer including a micro capsule layer formed so as to correspond to the display region of the TFT array substrate, and forming a color filter layer on the electrophoretic layer using the alignment keys so as to correspond to the respective pixel regions of the display region.

The formation of the color filter layer may include carrying out hydrophobic treatment of a surface of the electrophoretic layer, and spraying color droplets expressing a plurality of colors onto the surface of the electrophoretic layer, upon which the hydrophobic treatment is carried out, through a nozzle of an ink-jet printing device such that color droplets expressing one color are formed in one pixel region.

The hydrophobic treatment may be achieved by carrying out plasma treatment on the surface of the electrophoretic layer, on which the micro capsule layer is not formed, through gas of any one of $SF_6$ and $CF_4$ or a combination thereof.

The formation of the color filter layer may include forming an adhesive layer on a surface of the electrophoretic layer, on which the micro capsule layer is not formed, and preparing color droplets expressing a plurality of colors, and then spraying the color droplets onto the adhesive layer using surface roughness of the adhesive layer such that color droplets expressing one color are formed in one pixel region.

The method, may further include, after the formation of the color droplets expressing one color in one pixel region, hardening the color droplets by applying heat to the color droplets.

The method may further include forming a protective sheet on the color droplets.

The method may further include sealing the side surface of the electrophoretic layer so as to protect the electrophoretic layer.

The color droplets may be formed in an island type, an overlap type, or an island-overlap combination type by adjusting the amount of the color droplets formed in the respective regions.

The color filter layer is formed in a stripe type of red, green, and blue color filters, or is formed in a quad type of red, green, blue, and white color filters.

In another aspect of the present invention, a color electrophoretic display device includes a thin film transistor (TFT) array substrate including a display region, in which a plurality of pixel regions are defined in a matrix, and alignment keys provided at the outside of the display region, an electrophoretic layer including a micro capsule layer formed so as to correspond to the display region of the TFT array substrate, and a color filter layer formed on a surface of the electrophoretic layer, on which the micro capsule layer is not formed, and including a plurality of color droplets expressing different colors corresponding to the respective pixel regions of the display region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 6A and 6B are enlarged plan views respectively illustrating examples of the color filter layer of FIG. 5 in accordance with the first embodiment of the present invention and a modified embodiment thereof;

DETAILED DESCRIPTION OF THE INVENTION

Hereinafter, with reference to the accompanying drawings, a color electrophoretic display device in accordance with the present invention and a method for manufacturing the same will be described in detail.

Figure 1:
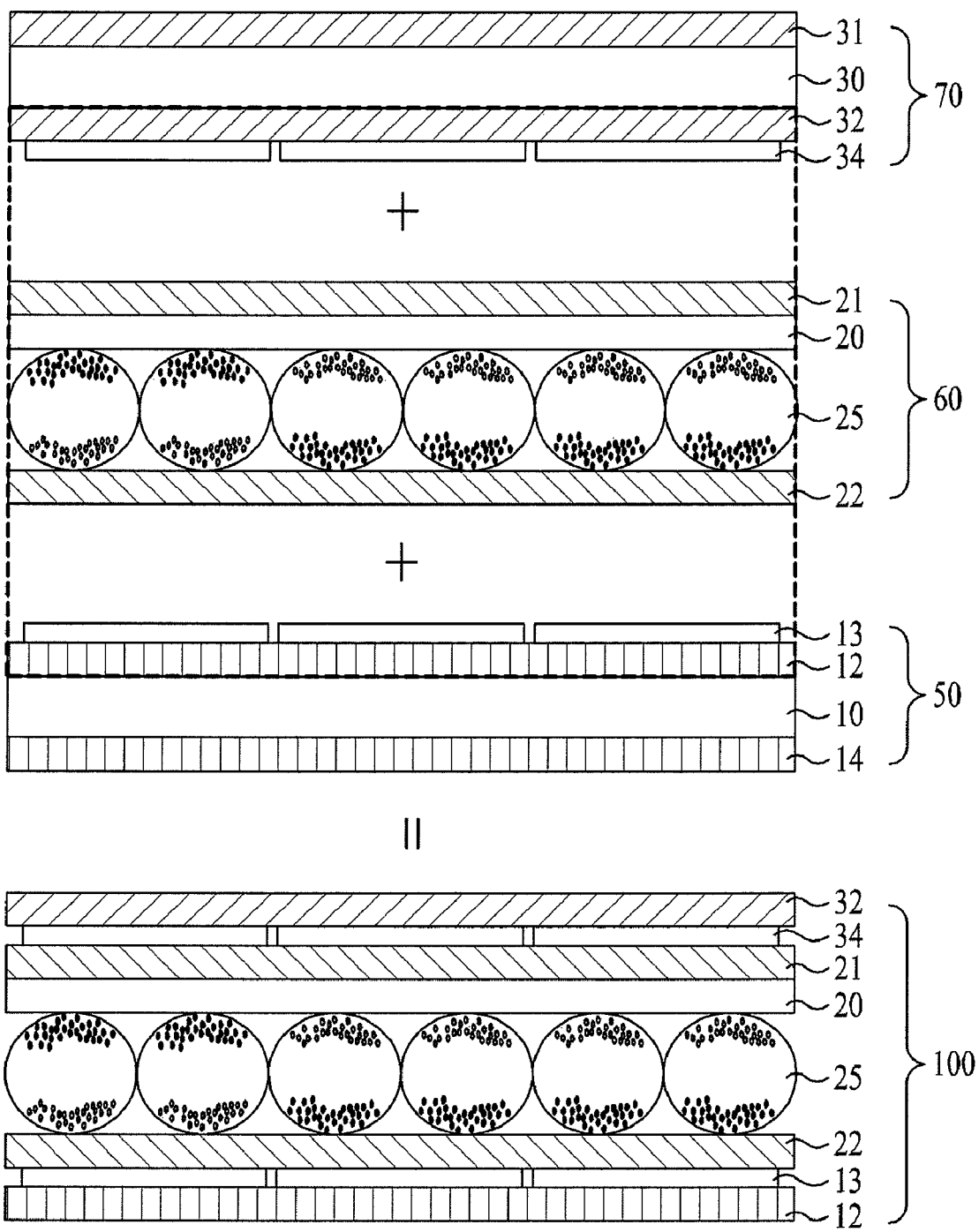
FIG. 1 is a longitudinal-sectional view illustrating a conventional color electrophoretic display device.
Figure 2A:
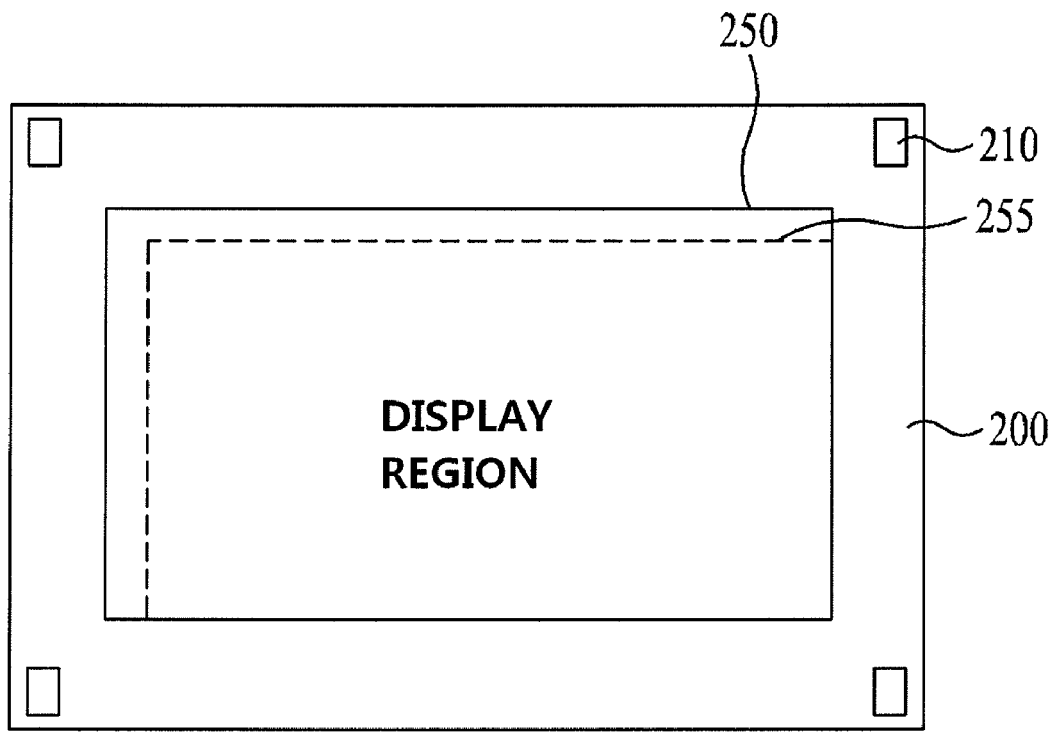
FIGS. 2A to 2C are plan views illustrating a TFT substrate, an electronic ink film, and a color filter layer during a process for manufacturing a color electrophoretic display device in accordance with a first embodiment of the present invention.
Figure 2B:
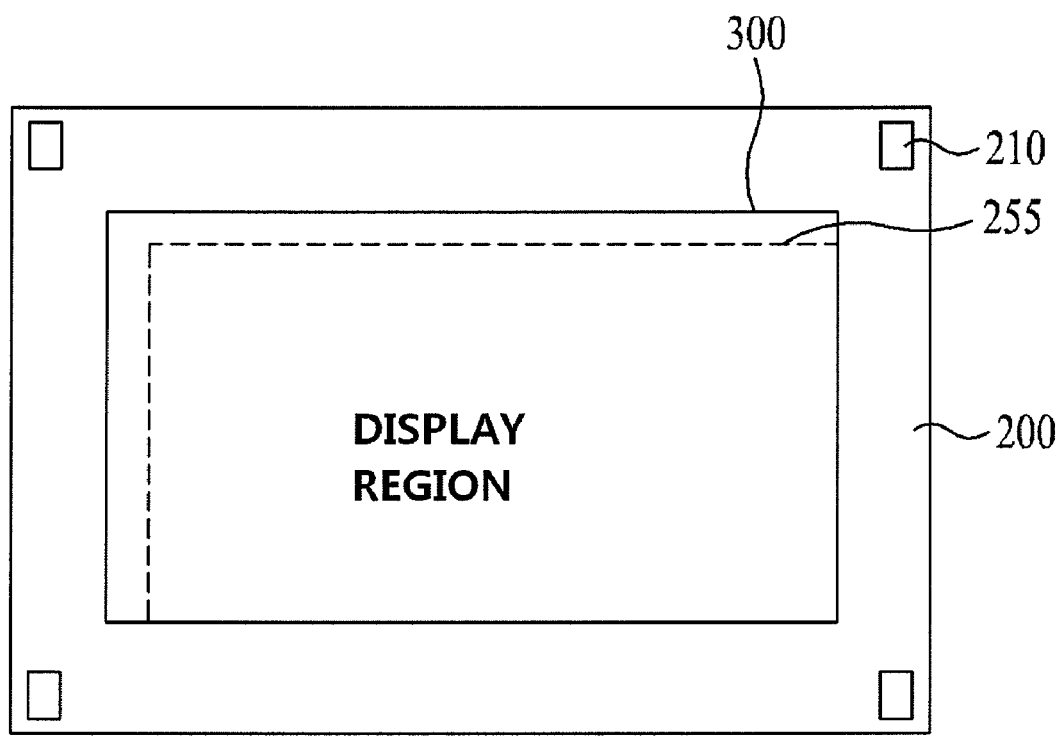
Figure 2C:
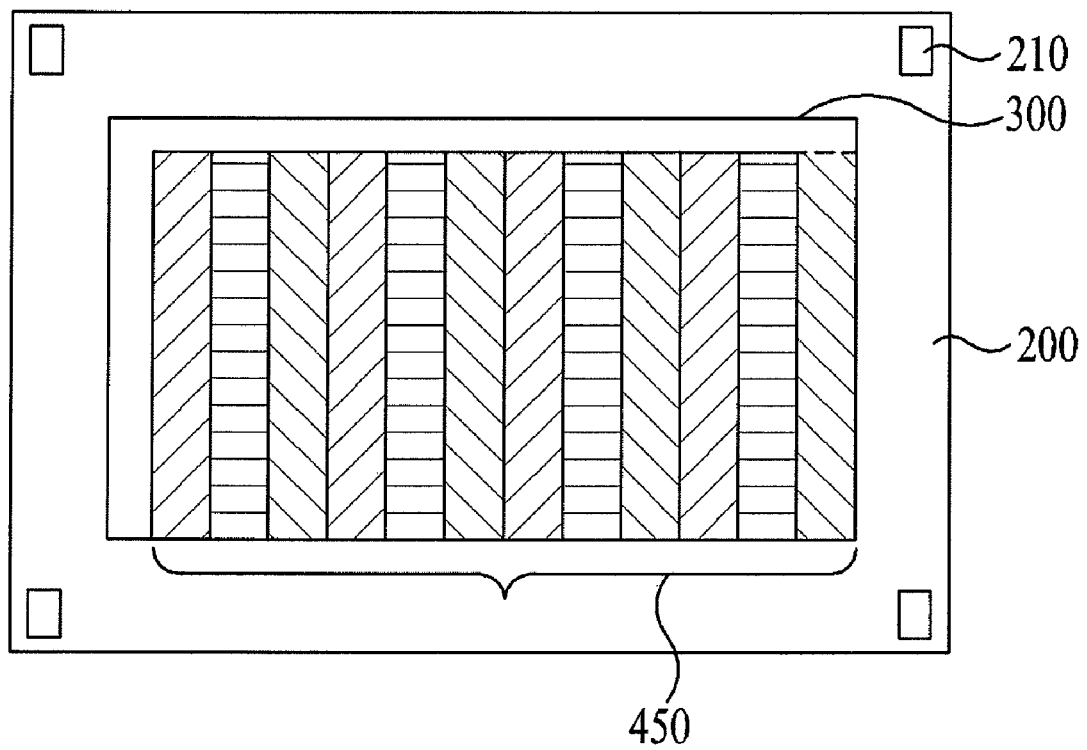
Figure 3A:
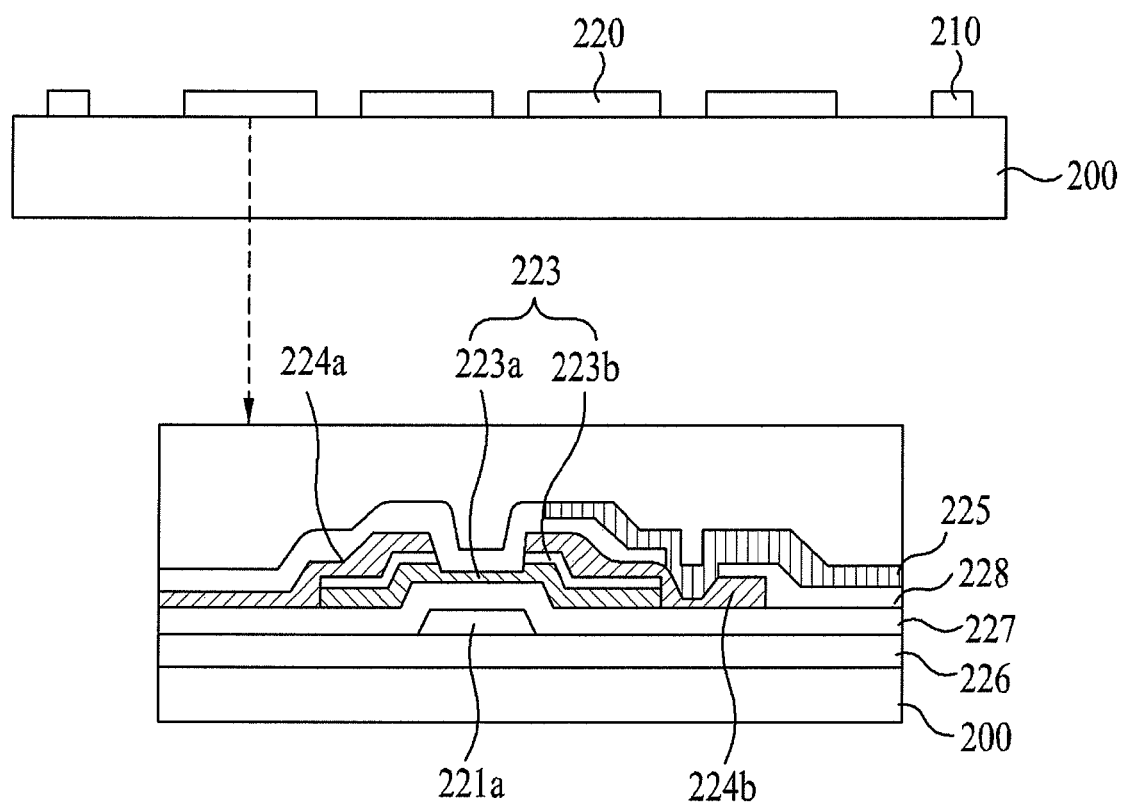
FIGS. 3A to 3C are longitudinal-sectional views respectively corresponding to FIGS. 2A to 2C.
Figure 3B:
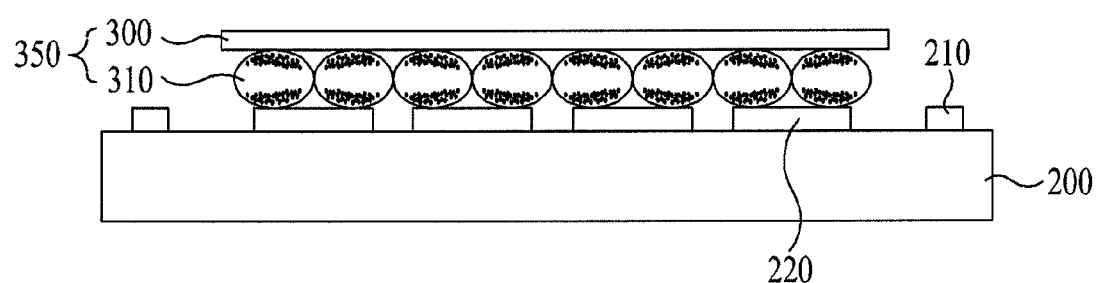
Figure 3C:
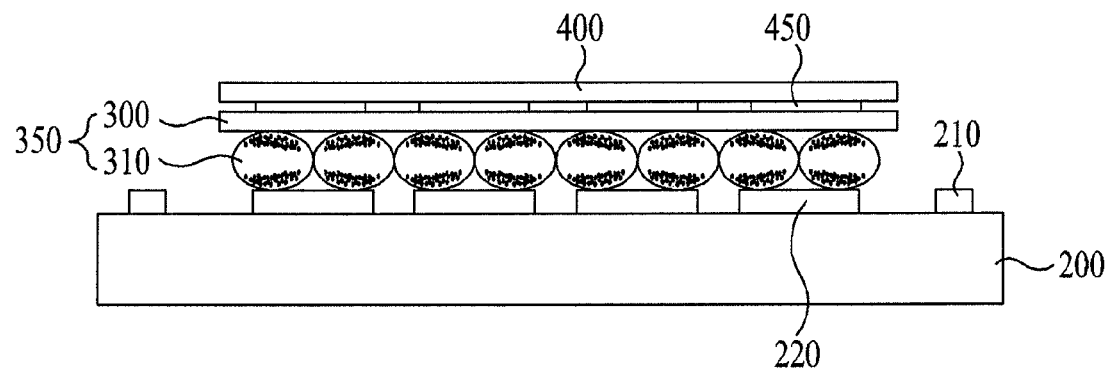

FIGS. 2A to 2C are plan views illustrating a TFT substrate, an electronic ink film, and a color filter layer during a process for manufacturing a color electrophoretic display device in accordance with a first embodiment of the present invention, and FIGS. 3A to 3C are longitudinal-sectional views respectively corresponding to FIGS. 2A to 2C.

In order to manufacture the color electrophoretic display device in accordance with the first embodiment of the present invention, as shown in FIGS. 2A and 3A, a TFT array mother substrate 200 is first prepared. Here, together with TFTs 220, alignment keys 210 to sense a position of a color filter layer are formed at the edge of the TFT array mother substrate 200.

Each of the TFTs 220 includes a gate electrode 221a formed in a designated region on the TFT array mother substrate 200, a gate insulating film 227 formed over the entire surface of the substrate 220 including the gate electrode 221a, an island-type semiconductor layer 223: 223a, 223b formed on the gate insulating film 227 to cover the gate electrode 221a, and a source electrode 224a and a drain electrode 224b formed at both sides of the semiconductor layer 223. Here, the semiconductor layer 223 is a structure obtained by stacking an amorphous silicon layer 223a and an impurity layer 223b, and some parts of thicknesses of the impurity layer 223b and the amorphous silicon layer 223a are removed between the source electrode 224a and the drain electrode 224b.

If the TFT array mother substrate 200 is made of a metal foil, such as a SUS foil, an insulting film 226 for insulation, such as an inorganic film or an organic film, is interposed between the TFT array mother substrate 200 and the gate electrode 221a.

A passivation film 228 is formed over the entire surface of the gate insulating film 227 including the source and drain electrodes 224a and 224b, a passivation film hole is formed by removing a designated region of the passivation film 228 on the upper surface of the drain electrode 224b, and a pixel electrode 225 is connected to the drain electrode 224b through the passivation film hole.

Here, the alignment keys 210 are formed in an edge region of the TFT array mother substrate 200 except for a display region 255, and may be formed together with TFTs or pixel electrodes during a TFT forming process or a pixel electrode forming process.

Non-described reference numeral 250 represents a pad region at the edge of the display region 255. The alignment keys 210 may be formed in any place at the outside of the display region 255 and the outside of the pad region 250. In this case, the alignment keys 210 may be removed during a subsequent scribing process to cut the TFT array mother substrate 200 into unit panels, or may remain in some regions at the outsides of the unit panels.

Thereafter, as shown in FIGS. 2B and 3B, an electrophoretic layer 350 including a micro capsule layer 310 on a substrate 300 is prepared, and is laminated on the TFT array mother substrate 200 such that the micro capsule layer 310 is opposite to the display region 255 of the TFT array mother substrate 200. In this case, the electrophoretic layer 350 may be thinned so as to have a thickness of less than several tens of μm, and thus the thinned electrophoretic layer 350 including the micro capsule layer 310 is bonded onto the TFT array mother substrate 200 including the TFTs 220 and pixel electrodes (not shown).

In this case, the substrate 300 may be made of a transparent electrode, or may be formed by carrying out a transparent conductive film treatment on a surface, corresponding to the micro capsule layer 310, on a transparent film.

As shown in FIGS. 2C and 3C, a color filter layer 450 is formed by carrying out hydrophobic treatment on the surface of the substrate 300 and then dotting red, green, and blue pigment materials, or an additional white pigment material on the surface of the substrate 300 using an ink-jet method.

In this case, the pigment materials are not mixed with each other, and are present in a droplet state on the surface of the substrate 300.

Here, dotting of the red, green, and blue pigment materials (or the white pigment material) may be individually carried out according to different colors, or may be carried out in only one process using nozzle spray holes of the involved pigment materials corresponding to different regions.

Thereafter, a protective sheet 400 to protect the color filter layer 450 is formed.

Hereinafter, manufacture of the TFT array mother substrate will be described in detail.

FIGS. 4A to 4E are longitudinal-sectional views illustrating a process for manufacturing the TFT substrate of the color electrophoretic display device in accordance with the present invention.

Figure 4A:
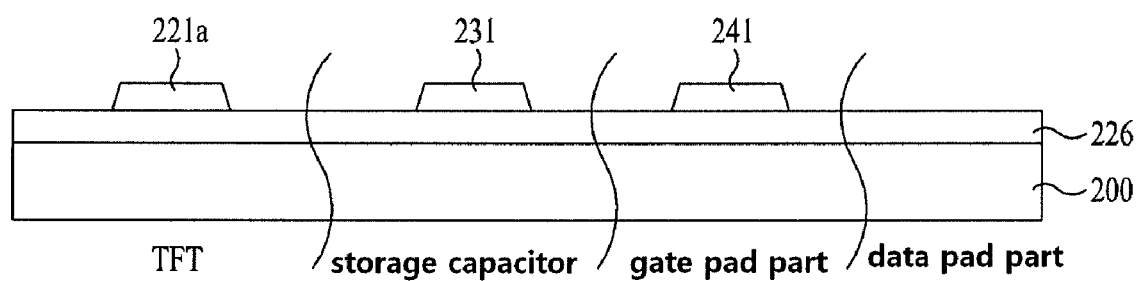
FIGS. 4A to 4E are longitudinal-sectional views illustrating a process for manufacturing the TFT substrate of the color electrophoretic display device in accordance with the present invention.

As shown in FIG. 4A, the insulating film 226 is deposited on the mother substrate 200.

Thereafter, gate electrodes 221a, first storage electrodes 231, and gate pad metals 241 are formed in designated regions by depositing a metal material layer, made of Mo/AlNd or Cu/Ti alloy, on the insulating film 226, and then selectively removing the metal material layer.

Figure 4B:
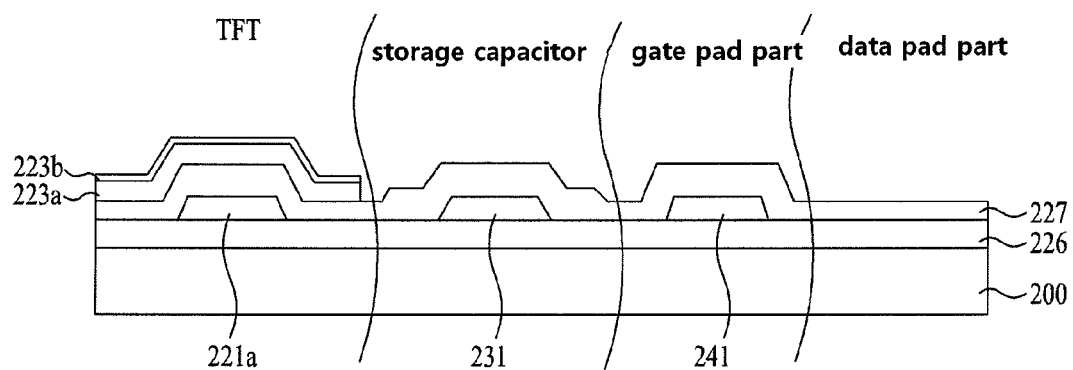

Thereafter, as shown in FIG. 4B, the gate insulating film 227 is formed over the entire surface of the substrate 200 including the gate electrodes 221a, the first storage electrodes 231, and the gate pad metals 241.

Thereafter, island-type stack structures, obtained by stacking the amorphous silicon layer 223a and the impurity layer 223b, to cover the gate electrodes 221a are formed on the gate insulating film 227.

Figure 4C:
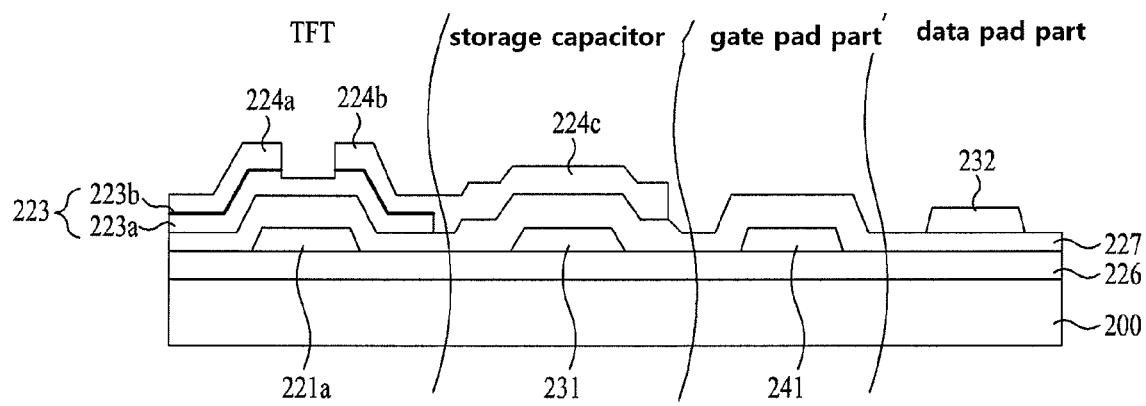

As shown in FIG. 4C, the source electrodes 224a and the drain electrodes 224b, which are separated from each other on the impurity layer 223b, second storage capacitors 224c, and date pad electrodes 232 in date pad regions are formed by depositing Mo, Cu/Ti alloy, or Mo/AlNd/Mo on the gate insulating film 227 including the amorphous silicon layer 223a and the impurity layer 223b, and then selectively removing the obtained layer. Here, the drain electrodes 224b and the second storage capacitors 224 may be formed integrally.

Thereafter, the impurity layer 223b between the source electrodes 224a and the drain electrodes 224b is removed, thereby defining channels of the semiconductor layer 223. Here, while a part of the thickness of the impurity layer 223b is removed, overetching of the amorphous silicon layer 223a is carried out and thus a part of the thickness of the amorphous silicon layer 223a is removed. A structure obtained, as described above, by stacking the amorphous silicon layer 223a and the impurity layer 223b is the semiconductor layer 223.

Figure 4D:
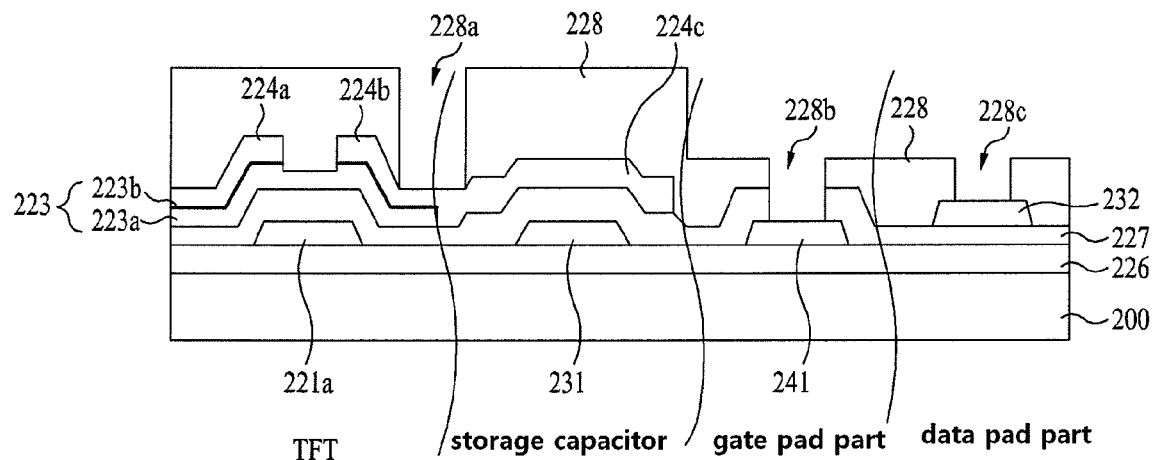
Figure 4E:
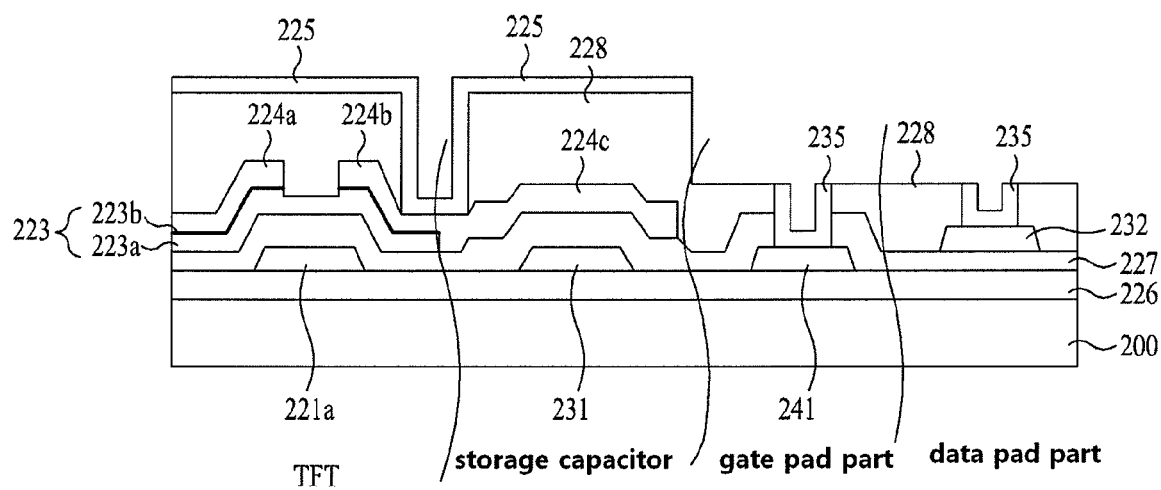

Thereafter, as shown in FIG. 4D, the passivation film 228 is formed over the entire surface of the gate insulating film 227 including the source and drain electrodes 224a and 224b and the second storage capacitors 224, first contact holes 228a to partially exposure the upper surfaces of the drain electrodes 224b and third contact holes 228c to expose the data pad electrodes 232 are formed by selectively removing the passivation film 228, and second contact holes 228b to expose the gate pad electrodes 241 are formed by selectively removing the passivation film 228 and the gate insulating film 227.

Thereafter, pixel electrodes 225 connected to the drain electrodes 224b, gate pads 235 connected to the gate pad electrodes 241, and data pads 235 connected to the data pad electrodes 232 are formed by depositing a transparent electrode filling the first to third contact holes 228a, 228b, and 228c on the passivation film 228 and then selectively removing the transparent electrode. On the other hand, if the alignment keys 210 provided at the edge of the TFT array mother substrate 200 are formed in the same layer as the pixel electrodes 225, a stack of the transparent pixel electrodes 225 and the source and drain electrodes 224a and 224b or the gate electrodes 221a formed thereunder is used or Mo is further deposited on the transparent pixel electrodes 225, thus allowing the alignment keys 210 to be visible when a color filter layer is formed on the transparent electrode.

Figure 5:
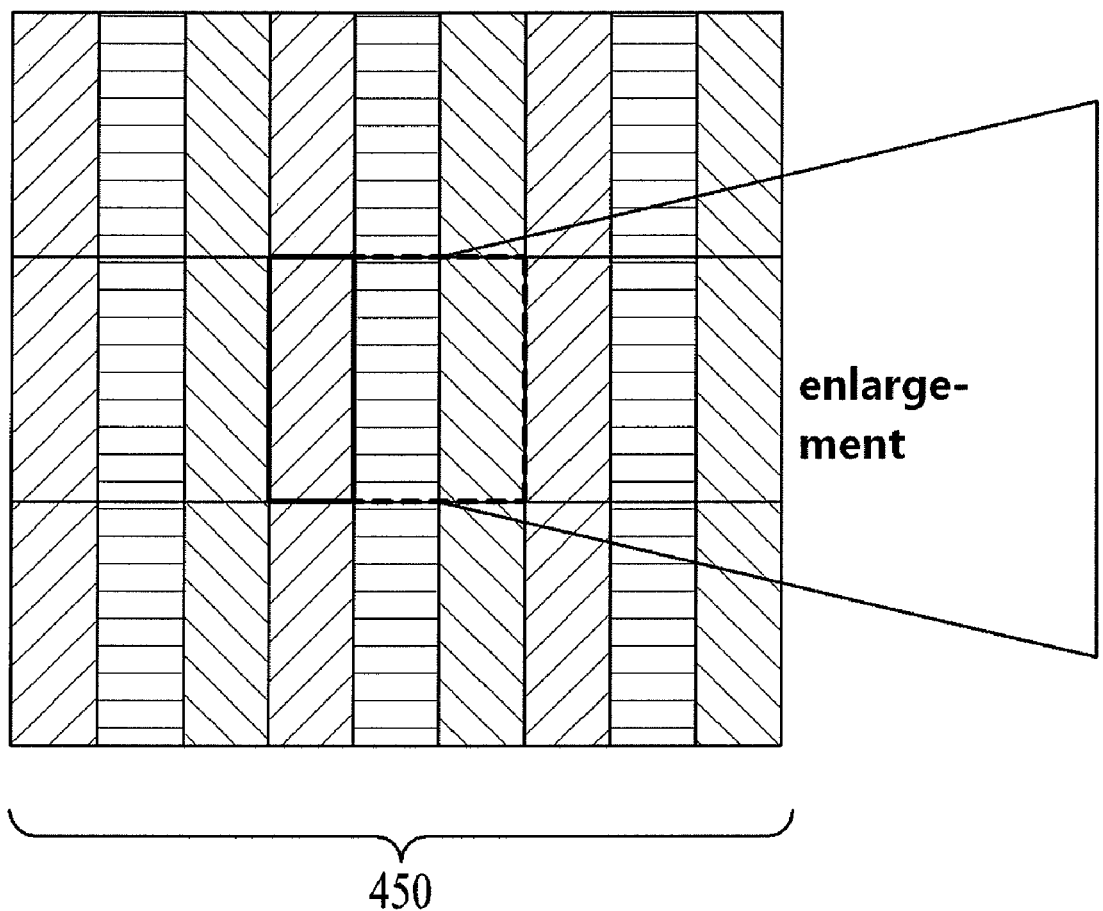
FIG. 5 is a plan view illustrating a stripe-type color filter layer in the color electrophoretic display device in accordance with the present invention.
Figure 6B:
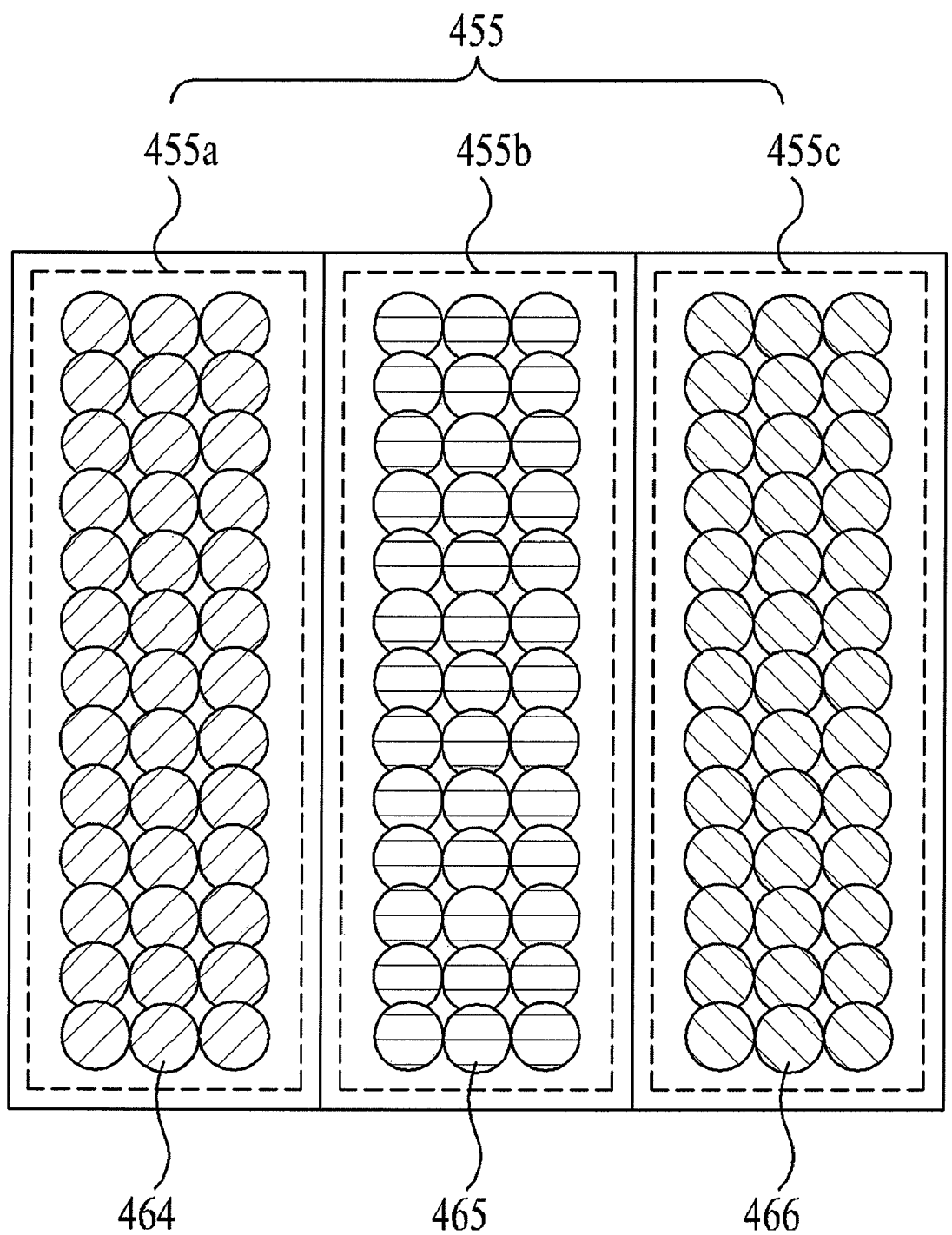

FIG. 5 is a plan view illustrating a stripe-type color filter layer in the color electrophoretic display device in accordance with the present invention, and FIGS. 6A and 6B are enlarged plan views respectively illustrating examples of the color filter layer of FIG. 5 in accordance with the first embodiment of the present invention and a modified embodiment thereof.

FIG. 5 illustrates a stripe-type color filter layer 450 in the color electrophoretic display device in accordance with the first embodiment of the present invention. That is, color filters having the same color are arranged in the longitudinal direction, and pigment materials corresponding to the color filters are formed in order of red, green, and blue.

FIG. 6A illustrates the stripe-type color filter layer 450 in accordance with the first embodiment of the present invention, in which color droplets 461, 462, and 463 in respective pixel regions 450a, 450b, and 450c are disposed at a low density so as to increase a light emission rate through the electrophoretic layer 350 under the color filter layer 450. That is, the color droplets 461, 462, and 463 in the respective pixel regions 450*a*, 450*b*, and 450*c* are formed in an island type and are separated from each other. If such a color filter layer 450 is provided, transmission of light emitted from the lower part is increased and thus high brightness is achieved. The color filter shown in FIG. 6A is referred to as an island type.

FIG. 6B illustrates a color filter layer 455 in accordance with a modified embodiment of the first embodiment of the present invention, in which color droplets 464, 465, and 466 in respective pixel regions 455*a*, 455*b*, and 455*c* are overlapped with each other.

Although the color filter layer 455 in FIG. 6B has lower brightness than that of the color filter layer 450 in FIG. 6A because the color filter layer 455 in FIG. 6B has higher density of the color droplets 464, 465, and 466 than that of the color droplets 461, 462, and 463 of the color filter layer 450 in FIG. 6A, the color filter layer 455 has a high color reproduction ratio and excellent color sense. The color filter shown in FIG. 6B is referred to as an overlap type.

In any one of the color filter layers in accordance with the first embodiment or the modified embodiment thereof, during the ink-jet dotting of the respective color droplets, a dotting region must not exceed each pixel region, and color bleeding must be prevented. In the above embodiments, since the color filter layer is formed after hydrophobic treatment is carried out on the rear surface (surface on which the micro capsule layer is not formed) of the electrophoretic layer, the droplets of the pigments during dotting do not move and remain in dotted positions, thus being capable of displaying colors.

The island-type color filter and the overlap-type color filter may be separately applied, or may be combined, if necessary.

Hereinafter, with reference to the accompanying drawings, formation of the color filter layer of the color electrophoretic display device in accordance with the present invention will be described.

Figure 7A:
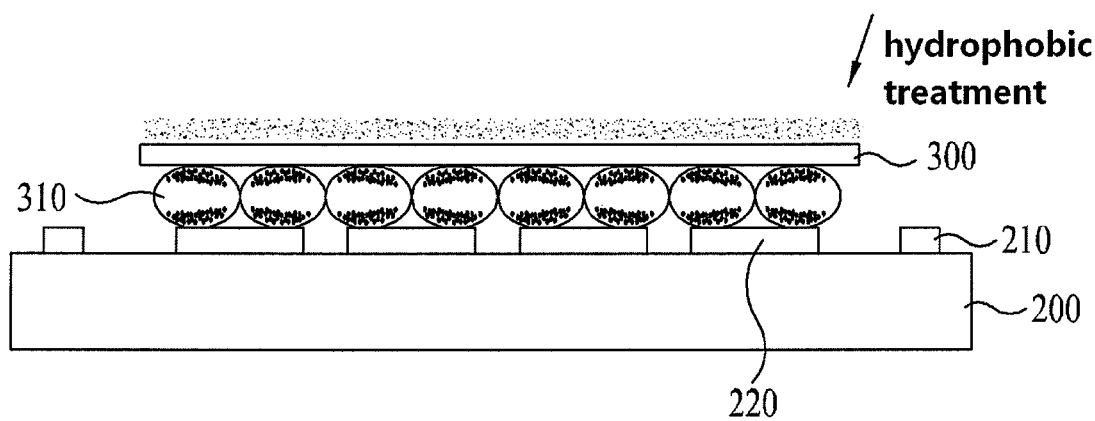
FIGS. 7A to 7C are longitudinal-sectional views illustrating a method for forming the color filter layer of the color electrophoretic display device in accordance with the present invention.
Figure 7B:
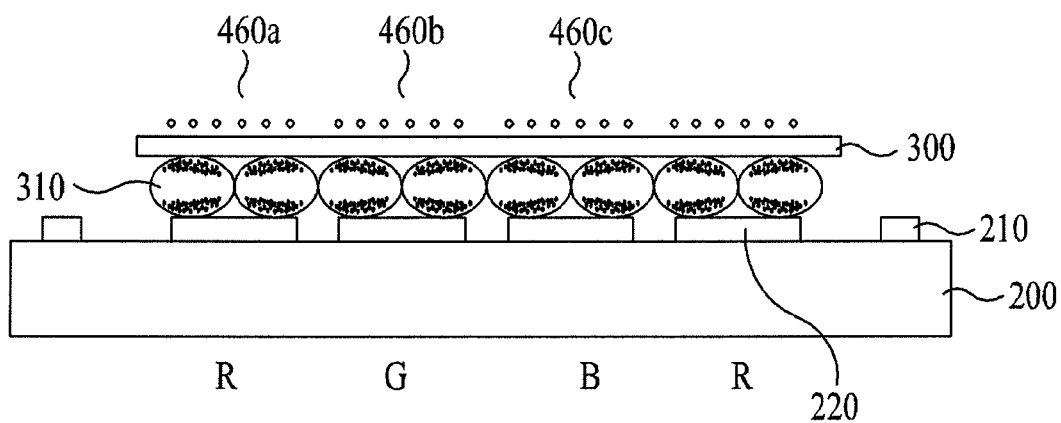
Figure 7C:
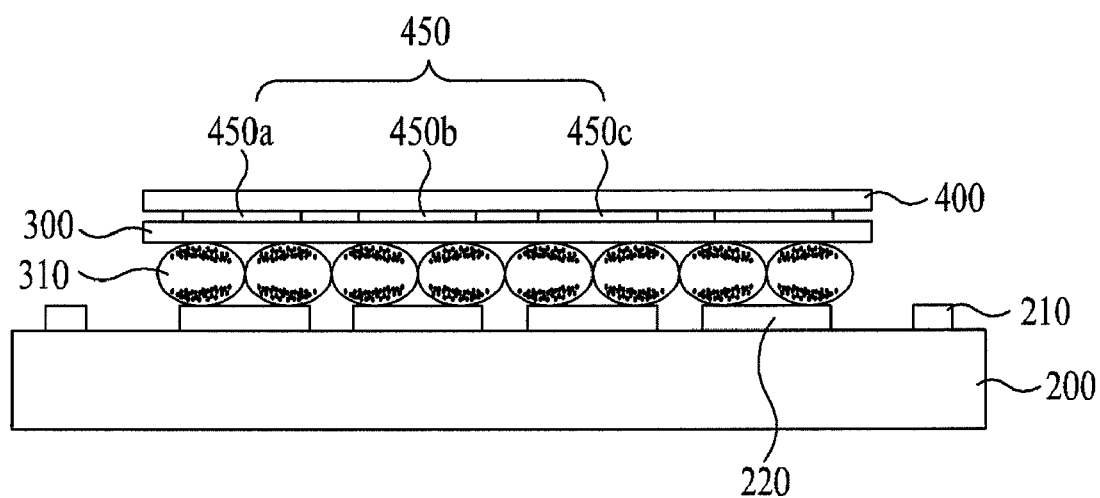

FIGS. 7A to 7C are longitudinal-sectional views illustrating a method for forming the color filter layer of the color electrophoretic display device in accordance with the present invention.

First, as shown in FIG. 7A, hydrophobic treatment using gas of any one of $SF_6$ and $CF_4$ or a combination thereof is carried out on a surface of the substrate 300, on which the micro capsule layer 310 is not formed.

By means of such hydrophobic treatment, hydrophilic color pigments dotted are not mixed with each other, and remain in a droplet state.

As shown in FIG. 7B, color droplets expressing a plurality of colors are sprayed onto the substrate 300, on which the hydrophobic treatment was carried out, through a nozzle of an ink-jet printing device, and thereby each of the color droplets 460*a*, 460*b*, and 460*c*, expressing one color, is formed in one pixel region. In this case, dotting of the red, green, blue color droplets may be simultaneously carried out in corresponding regions, or may be respectively carried out through separate processes. From the viewpoint of process characteristics of the present invention, the former method is preferable.

Thereafter, hardening is carried out by applying heat so as to allow the color droplets 460*a*, 460*b*, and 460*c* to stably remain. In this case, pigments used to form the color droplets 460*a*, 460*b*, and 460*c* may be pigments, which are capable of being hardened by heat.

Thereafter, as shown in FIG. 7C, a protective sheet 400 for protection may be further formed on the hardened color filter layer 450: 450*a*, 450*b*, and 450*c*.

On the other hand, the hydrophobic treatment may be carried out using surface roughness and hydrophobic properties of an adhesive layer (not shown) formed on the surface of the substrate 300, on which the micro capsule layer 310 is not formed, instead of the above-described plasma treatment using $SF_6$ or $CF_4$ gas.

In this case, after the formation of the adhesive layer, color droplets expressing a plurality of colors may be prepared above the adhesive layer and then be sprayed onto the adhesive layer such that each of the color droplets, expressing one color, is formed in one pixel region. Thereafter, the same hardening process may be carried out.

Sealing between the side surface of the electrophoretic layer 350 and the TFT array mother substrate 200 may be carried out using a sealant to prevent the influence of humidity and outside air on the side surface of the electrophoretic layer 350. The sealing may be achieved by drawing the sealant at the outside of the electrophoretic layer 350 or on the TFT array mother substrate 300 prior to bonding the electrophoretic layer 350 and the TFT array mother substrate 300, and then bonding the electrophoretic layer 350 and the TFT array mother substrate 300 to each other.

The color droplets may be formed in the island type, the overlap type, or the island-overlap combination type by adjusting the amount of the color droplets sprayed onto each of the respective pixel regions.

Figure 8A:
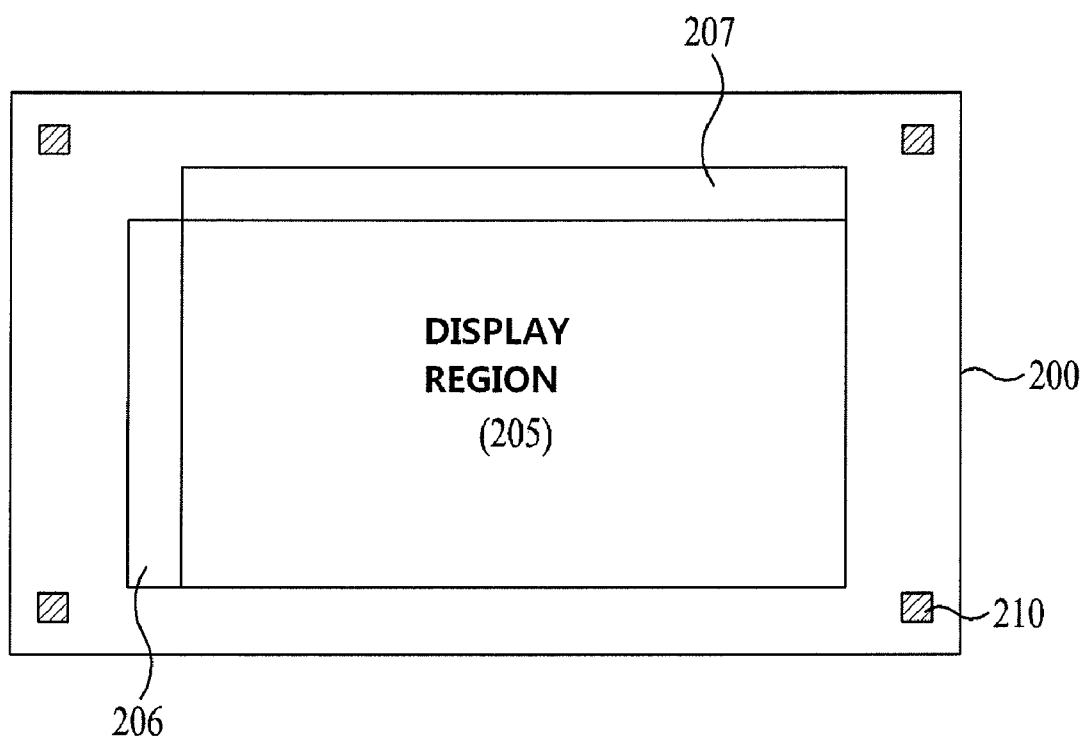
FIGS. 8A to 8C are plan views illustrating a process for manufacturing a color electrophoretic display device in accordance with a second embodiment of the present invention.
Figure 8B:
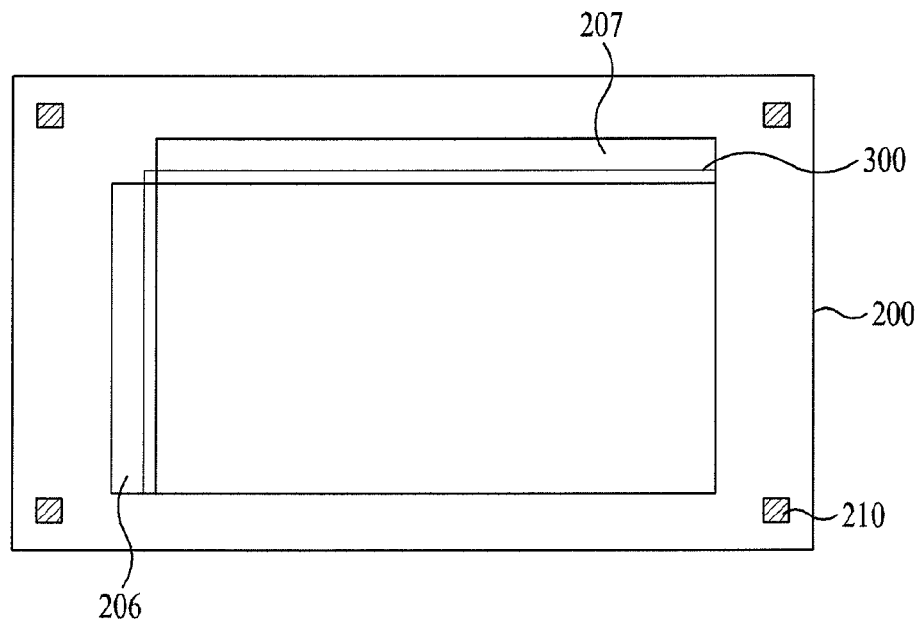
Figure 8C:
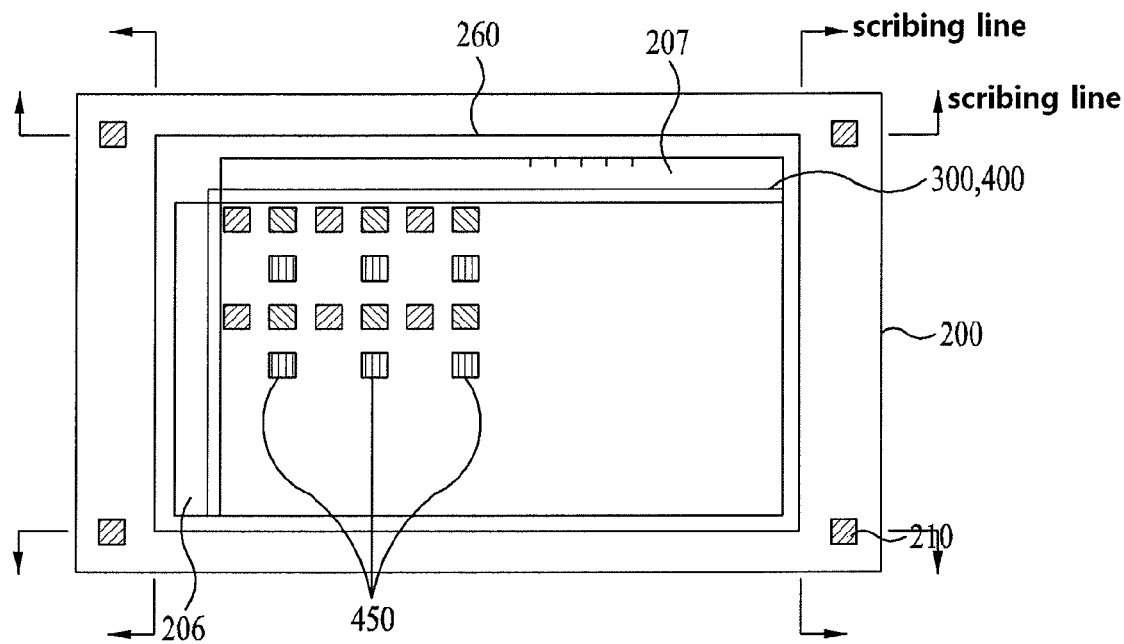

FIGS. 8A to 8C are plan views illustrating a process for manufacturing a color electrophoretic display device in accordance with a second embodiment of the present invention.

The process in accordance with the second embodiment is nearly identical with that in accordance with the first embodiment except that the color filter layer 450 in accordance with the second embodiment is formed in a quad type instead of the stripe type.

Here, reference numerals 206 and 207 in FIG. 8A represent a gate pad region and a data pad region, respectively, and from FIG. 8B, it is apparent that the substrate 300 of the electrophoretic layer 350 has an area which is slightly overlapped with the pad regions 206 and 207.

FIG. 8C shows scribing lines, along which the TFT array mother substrate 200 is cut into unit panels. Here, the alignment keys 210 may be placed in a region which is removed by the scribing process, or may remain at the outside (a part except for the display region) of the unit panel.

A seal pattern to prevent humidity transfer may be further formed at the edge of a surface of the color filter layer 450 or the substrate 300 of the electrophoretic layer 350, which is opposite to the TFT array mother substrate 200.

Further, non-described reference numeral 260 represents lines, along which the TFT array mother substrate 200 is cut into unit panels, corresponding to the scribing lines. Although FIGS. 8A to 8C illustrate one unit panel as being located in the TFT array mother substrate 200, a plurality of unit panels may be arranged in the TFT array mother substrate, and these unit panels are cut along the scribing lines.

Figure 9:
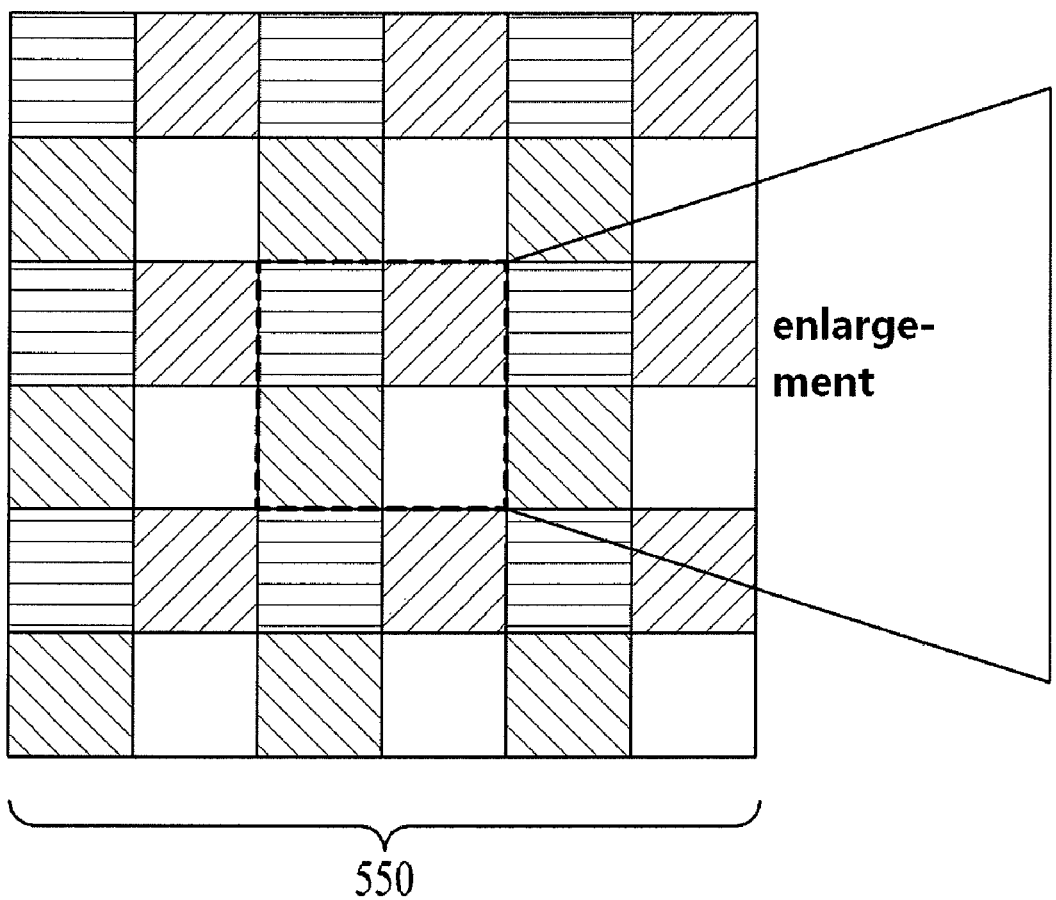
FIG. 9 is a plan view illustrating a quad-type color filter layer in the color electrophoretic display device in accordance with the present invention.
Figure 10A:
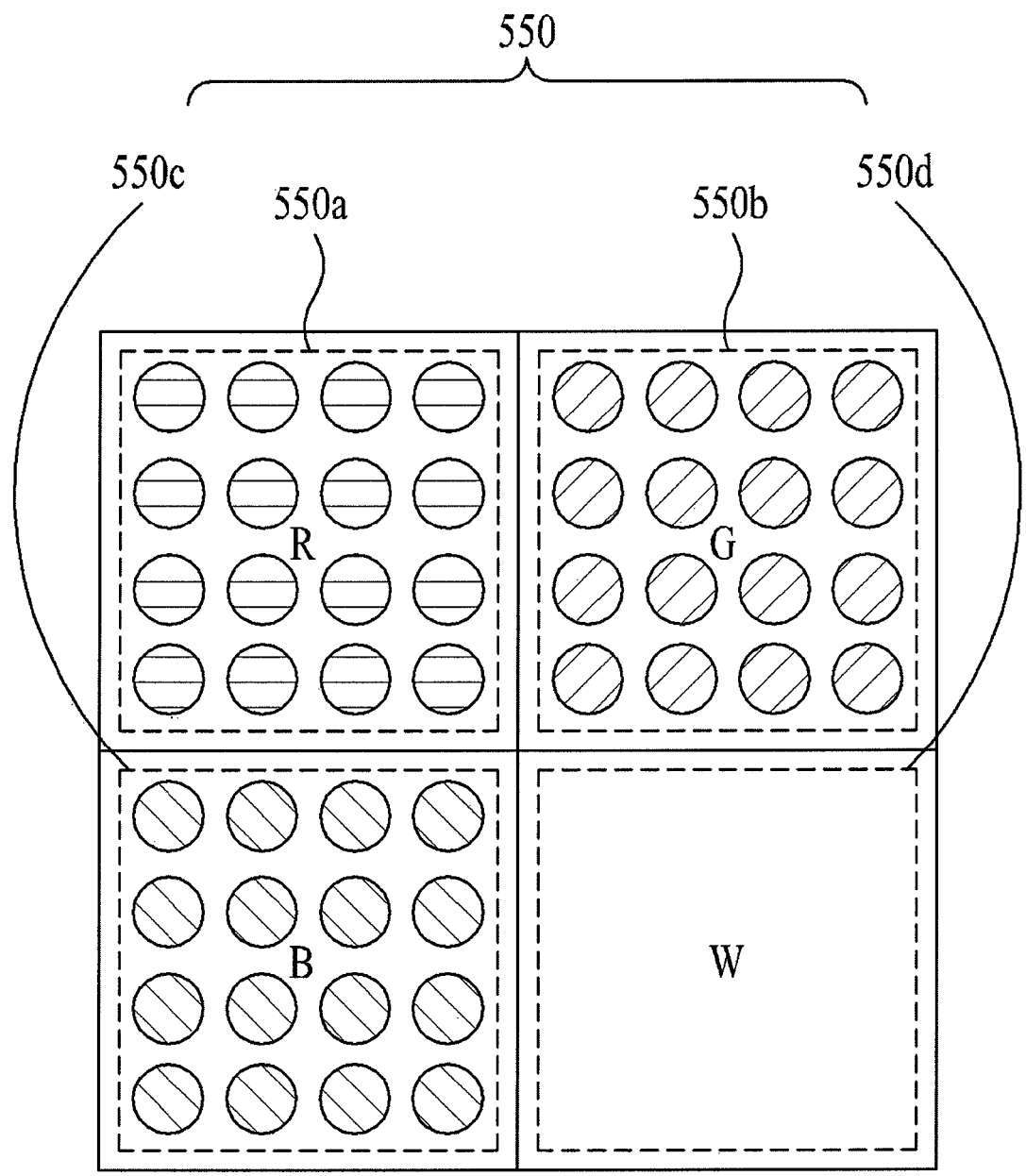
FIGS. 10A ad 10B are enlarged plan views respectively illustrating examples of the color filter layer of FIG. 9 in accordance with the second embodiment of the present invention and a modified embodiment thereof.

FIG. 9 is a plan view illustrating a quad-type color filter layer in the color electrophoretic display device in accordance with the present invention, and FIGS. 10A ad 10B are enlarged plan views respectively illustrating examples of the color filter layer of FIG. 9 in accordance with the second embodiment of the present invention and a modified embodiment thereof.

FIG. 9 illustrates that red, green, blue, and white color filters are sequentially formed in four pixel regions defined to have two pixels in the horizontal direction and two pixels in the vertical directions. Here, the order of the color filters may be changed, and the white color filter may be formed by filling the corresponding pixel with a white pigment or a transparent organic film or by emptying the corresponding pixel. Here, the case in which the white color filter is formed by emptying the corresponding pixel will be described.

FIG. 10A illustrates the quad-type color filter layer 550 in accordance with the second embodiment of the present invention, in which color droplets in R, G, and B pixel regions 550a, 550b, and 550c are disposed at a low density so as to increase a light emission rate through the electrophoretic layer 350 under the color filter layer 550. That is, the color droplets in the respective pixel regions 550a, 550b, and 550c are formed in an island type and are separated from each other. If such a color filter layer 550 is provided, transmission of light emitted from the lower part is increased and thus high brightness is achieved. The color filter shown in FIG. 10A is referred to as the island type.

Figure 10B:
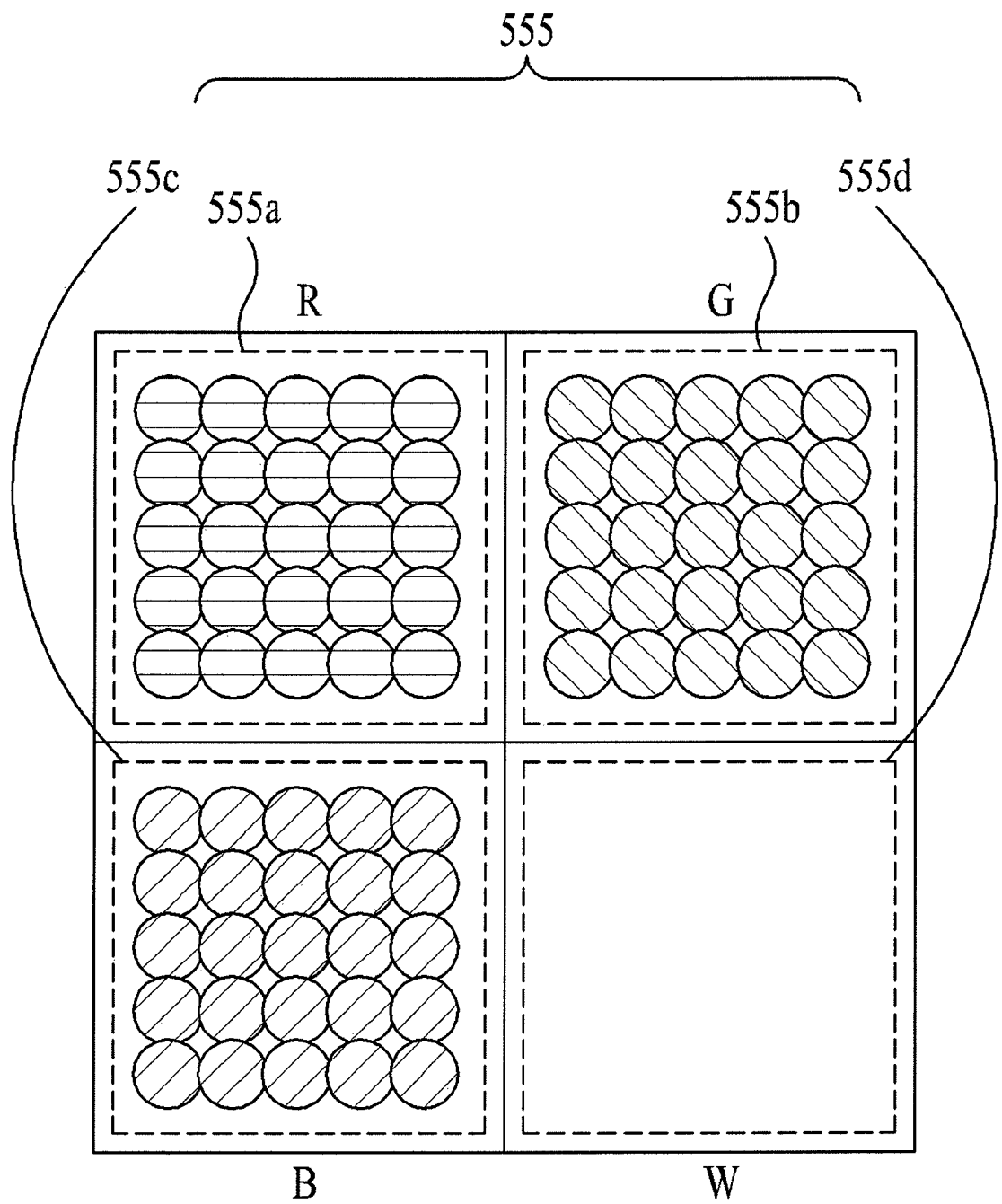

FIG. 10B illustrates a color filter layer 555 in accordance with a modified embodiment of the second embodiment of the present invention, in which color droplets in respective pixel regions 555a, 555b, and 555c are overlapped with each other.

Although the color filter layer 555 in FIG. 10B has lower brightness than that of the color filter layer 550 in FIG. 10A because the color filter layer 555 in FIG. 6B has higher density of the color droplets than that of the color droplets of the color filter layer 550 in FIG. 6A, the color filter layer 555 has a high color reproduction ratio and excellent color sense. The color filter shown in FIG. 10B is referred to as the overlap type.

In any one of the color filter layers in accordance with the second embodiment or the modified embodiment thereof, during the ink-jet dotting of the respective color droplets, a dotting region must not exceed each pixel region, and color bleeding must be prevented. In the above embodiments, since the color filter layer is formed after hydrophobic treatment is carried out on the rear surface (surface on which the micro capsule layer is not formed) of the electrophoretic layer, the droplets of the pigments during dotting do not move and remain in dotted positions, thus being capable of displaying colors.

The island-type color filter and the overlap-type color filter may be separately applied, or may be combined, if necessary.

Figure 11A:
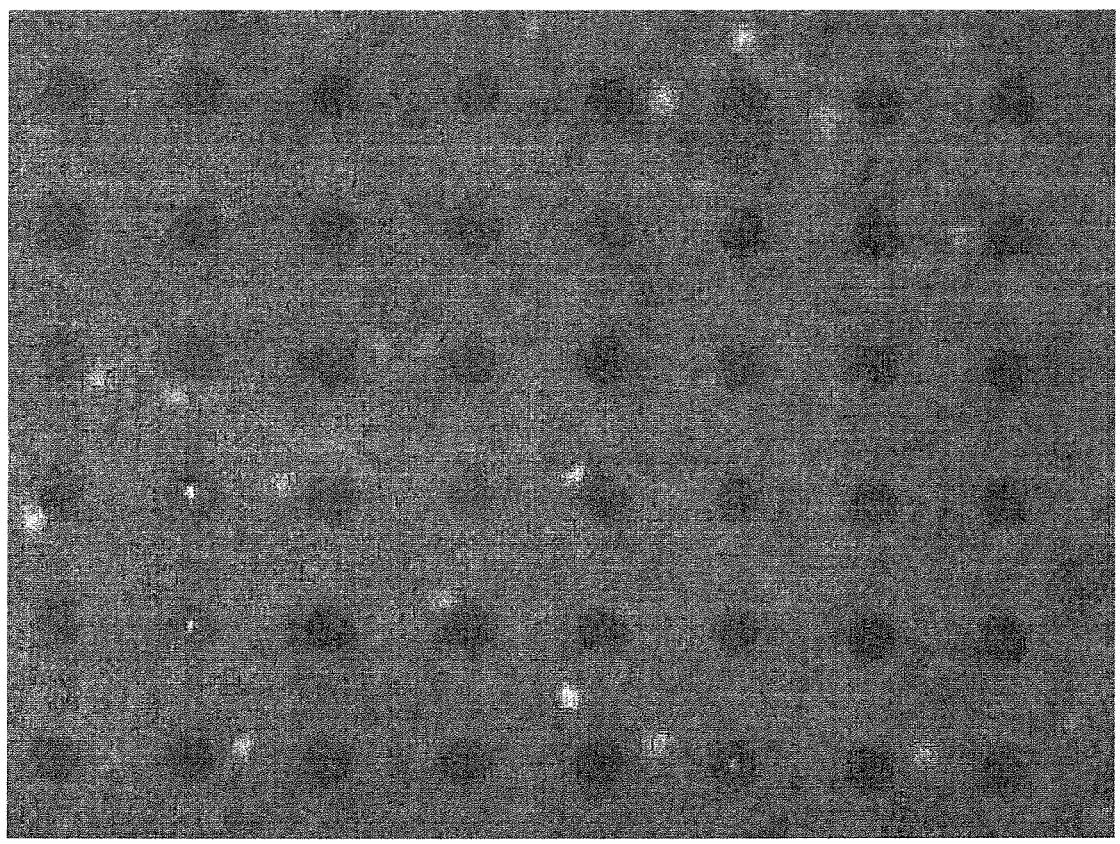
FIGS. 11A to 11C are photographs of droplets observed after formation of the color filter layer in the color electrophoretic display device in accordance with the present invention.
Figure 11B:
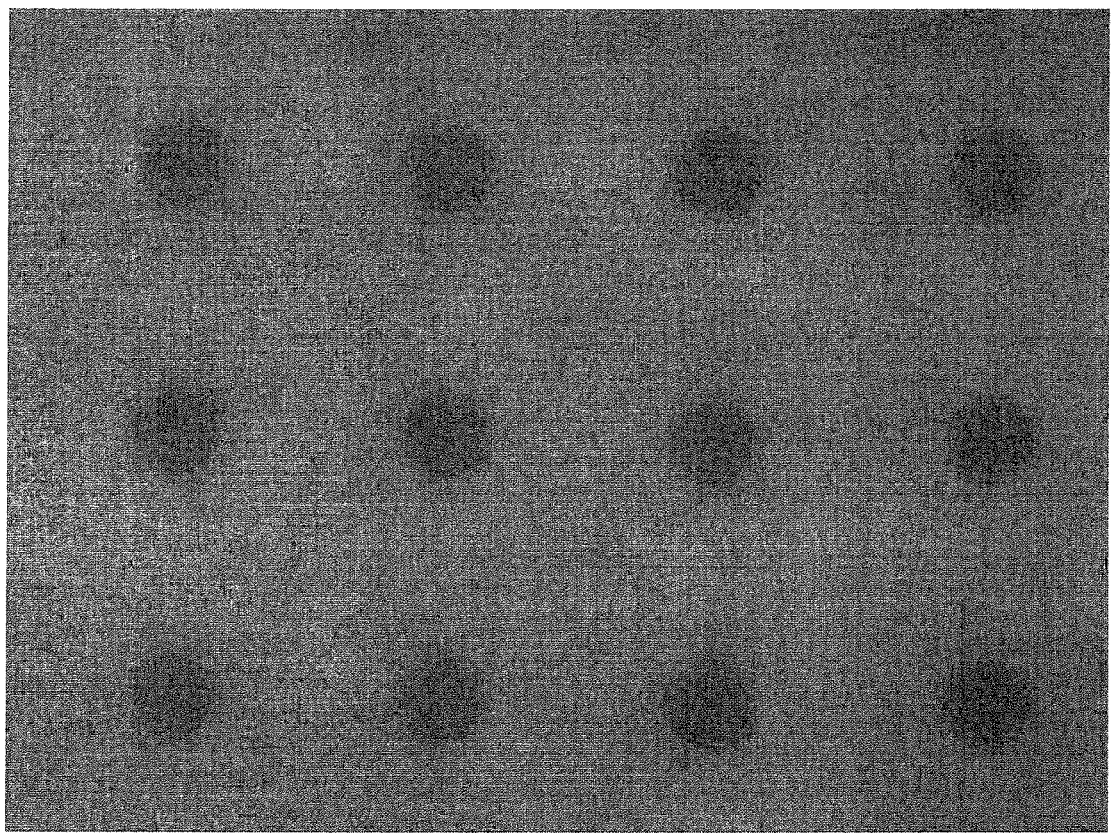
Figure 11C:
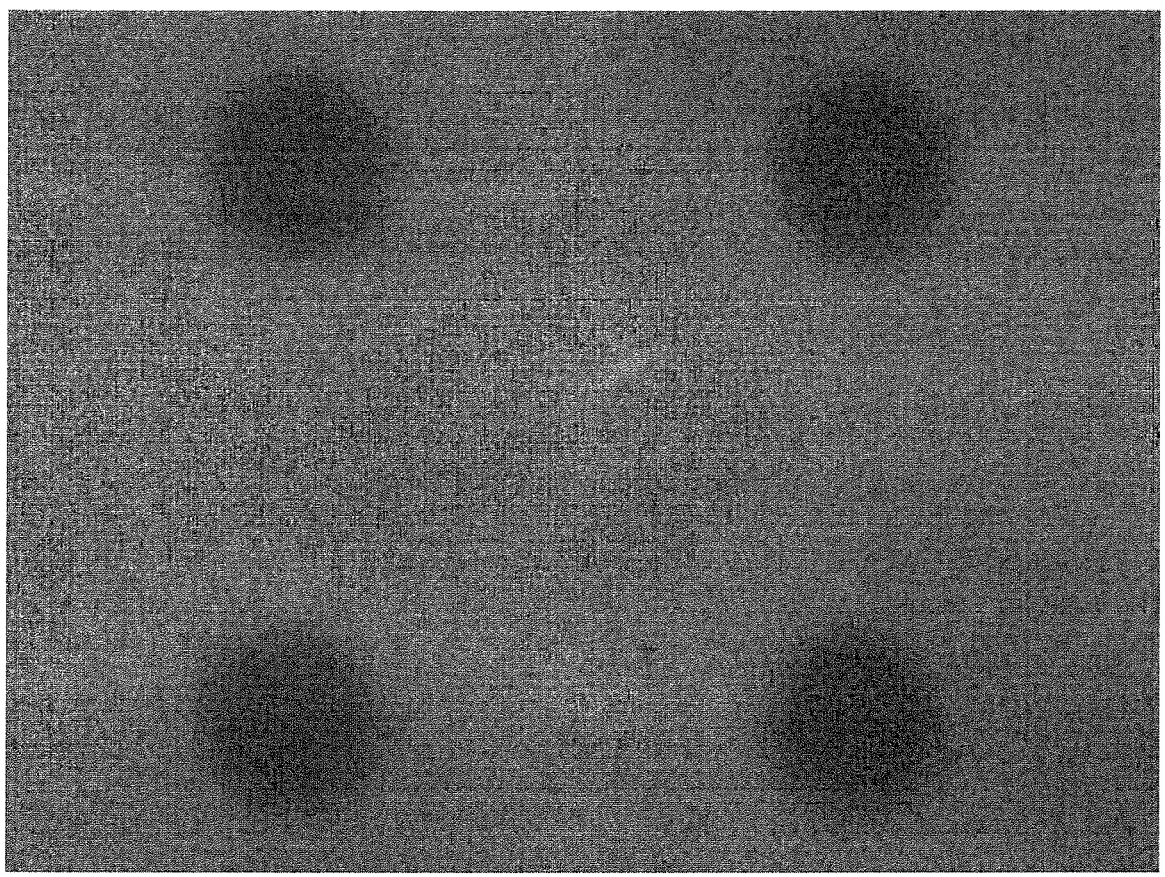

FIGS. 11A to 11C are photographs of droplets observed after formation of the color filter layer in the color electrophoretic display device in accordance with the present invention.

FIGS. 11A to 11C are photographs of the droplets of the color filter layer formed after hydrophobic treatment, which are gradually enlarged. That is, it is observed that the droplets of pigments do not exceed pixel regions and remain in dotted positions, and thus it is understood that the island-type or overlap-type color droplets may be freely formed into the stripe-type or quad-type color filter.

As described above, the color electrophoretic display device includes the TFT array substrate 200 including a display region 250, in which a plurality of pixel regions are defined in a matrix, and alignment keys provided at the outside of the display region, the electrophoretic layer 350 including the micro capsule layer 310 formed corresponding to the display region 250 of the TFT array substrate 200, and the color filter layer including a plurality of color droplets formed on a surface of the electrophoretic layer 350, on which the micro capsule layer 310 is not formed, corresponding to the respective pixel regions of the display region 250.

The above-described color electrophoretic display device and method for manufacturing the same in accordance with the present invention has the following effects:

First, a color filter layer is formed on a surface of an electrophoretic layer after hydrophobic treatment is carried out on the surface of the electrophoretic layer, and thus droplets forming color filters remain intact in pixel regions, thereby being capable of omitting a partition to divide the respective pixel regions from each other.

Second, the color filter layer is formed on the electrophoretic layer by dotting pigments in an ink-jet method using alignment keys on a TFT array substrate under the electrophoretic layer, and thus a bonding process between the color filter layer and the electrophoretic layer is not required, thereby preventing yield lowering due to misalignment.

Third, the color filter layer including the color filters expressing a plurality of colors, i.e., three colors, four colors, or more, may be formed in the ink-jet method using hydrophobic properties of the surface of the electrophoretic layer.

Fourth, a process is simplified by the above effects, and an adhesive layer and a SUS layer are omitted, thereby improving yield and cutting down on expenses, and thus improving productivity.

It will be apparent to those skilled in the art that various modified embodiments and variations can be made in the present invention without departing from the spirit or scope of the inventions. Thus, it is intended that the present invention covers the modified embodiments and variations of this invention provided they come within the scope of the appended claims and their equivalents.

What is claimed is:

1. A method for manufacturing a color electrophoretic display device, comprising:
   forming a thin film transistor (TFT) array substrate including a display region, in which a plurality of pixel regions are defined in a matrix, and alignment keys provided at the outside of the display region;
   forming an electrophoretic layer including a micro capsule layer formed so as to correspond to the display region of the TFT array substrate; and
   forming a color filter layer on the electrophoretic layer using the alignment keys so as to correspond to the respective pixel regions of the display region, wherein the formation of the color filter layer includes:
   carrying out hydrophobic treatment of a surface of the electrophoretic layer; and
   spraying color droplets expressing a plurality of colors onto the surface of the electrophoretic layer, upon which the hydrophobic treatment is carried out, through a nozzle of an ink-jet printing device such that color droplets expressing one color are formed in one pixel region.

2. The method according to claim 1, wherein the hydrophobic treatment is achieved by carrying out plasma treatment on the surface of the electrophoretic layer, on which the micro capsule layer is not formed, through gas of any one of $SF_6$ and $CF_4$ or a combination thereof.

3. The method according to claim 1, further comprising:
   after the formation of the color droplets expressing one color in one pixel region, hardening the color droplets by applying heat to the color droplets.

4. The method according to claim 1, further comprising forming a protective sheet on the color droplets.

5. The method according to claim 1, further comprising sealing a side of the electrophoretic layer.

6. The method according to claim 1, wherein the color droplets are formed in an island type, an overlap type, or an island-overlap combination type by adjusting the amount of the color droplets formed in the respective regions.

* * * * *